US012575209B2

(12) United States Patent
Siddique et al.

(10) Patent No.: US 12,575,209 B2
(45) Date of Patent: Mar. 10, 2026

(54) METHOD AND SYSTEM FOR LIGHT ABSORPTION ENHANCEMENT IN PHOTODIODES USING ON-CHIP PHASE MODULATING THIN-FILM OPTICS, RESONANT STRUCTURES AND METASURFACES

(71) Applicant: Samsung Electronics Co., Ltd., Suwon-si (KR)

(72) Inventors: Radwanul Hasan Siddique, Monrovia, CA (US); Yibing Michelle Wang, Temple City, CA (US); Mahsa Torfeh, Los Angeles, CA (US); Tze-Ching Fung, Diamond Bar, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 374 days.

(21) Appl. No.: 18/101,578

(22) Filed: Jan. 25, 2023

(65) Prior Publication Data

US 2024/0120360 A1      Apr. 11, 2024

Related U.S. Application Data

(60) Provisional application No. 63/413,591, filed on Oct. 5, 2022.

(51) Int. Cl.
  *H10F 39/00*      (2025.01)
  *G01J 1/04*      (2006.01)
  *H10F 39/18*      (2025.01)

(52) U.S. Cl.
  CPC ........ *H10F 39/8067* (2025.01); *G01J 1/0429* (2013.01); *H10F 39/184* (2025.01)

(58) Field of Classification Search
  CPC .. H10F 39/8067; H10F 39/184; H10F 39/805; H10F 39/802; H10F 39/18; H10F 39/806; G01J 1/0429
  See application file for complete search history.

(56) References Cited

U.S. PATENT DOCUMENTS 11,309,444 B1      4/2022   Wang et al.
2012/0061553 A1      3/2012   Yokogawa
(Continued)

FOREIGN PATENT DOCUMENTS

CN      114695397 A      7/2022
CN      217280770 U      8/2022
CN      217306506 U      8/2022

OTHER PUBLICATIONS

Choudhury, Sajid M. et al., "Material Platforms for Optical Metasurfaces", Nanophotonics, vol. 7, No. 6, 2018, pp. 959-987.
(Continued)

*Primary Examiner* — Casey Bryant
(74) *Attorney, Agent, or Firm* — Renaissance IP Law Group LLP

(57)      ABSTRACT

A pixel for an image sensor is disclosed that includes a photodiode, a thin-film layer and a reflective layer. The photodiode includes a first side and a second side that is opposite the first side, and receives incident light on the first side. The thin-film layer is formed on the first side of the photodiode and provides a unidirectional phase-shift to light passing from the photodiode to the thin-film layer. The thin-film layer has a refractive index that less than a refractive index of material forming the photodiode. The unidirectional phase-shift may be a unidirectional π phase shift at a target near-infrared light wavelength. The reflective layer is formed on the second side of the photodiode and reflects light passing from the photodiode to the reflective layer toward the first side of the photodiode. The reflective layer may be a thin-film layer, a Distributed Bragg Reflector layer, or a metal.

20 Claims, 7 Drawing Sheets

(56) References Cited

U.S. PATENT DOCUMENTS

| | | | |
|---|---|---|---|
| 2017/0200760 A1 | 7/2017 | Zhang et al. | |
| 2020/0050094 A1* | 2/2020 | Han | G03B 21/2033 |
| 2021/0028318 A1 | 1/2021 | Tseng et al. | |
| 2021/0190593 A1* | 6/2021 | Yao | G02B 1/002 |
| 2021/0191021 A1* | 6/2021 | Siddique | H10F 39/8023 |
| 2021/0223104 A1 | 7/2021 | Siddique et al. | |
| 2021/0223444 A1 | 7/2021 | Siddique et al. | |
| 2021/0311240 A1 | 10/2021 | Siddique et al. | |

OTHER PUBLICATIONS

Ren Hao et al., "Recent Progress in Organic Photodetectors and Their Applications", Advanced Science, vol. 8, No. 1, 2020, pp. 1-23.
Sun, Mingyu et al., "Efficient Visible Light Modulation Based on Electrically Tunable all Dielectric Metasurfaces Embedded in Thin-Layer Nematic Liquid Crystals", Scientific Reports, vol. 9, No. 8673, 2019, pp. 1-9.
Wang Cheng et al., "Metasurface-Assisted Phase-Matching-Free Second Harmonic Generation in Lithium Niobate Waveguides", Nature Communications, vol. 8, No. 2098, 2017, pp. 1-7.
Zahra, Sidrish et al., "Electromagnetic Metasurfaces and Reconfigurable Metasurfaces: A Review", Frontiers in Physics, vol. 8, No. 593411, 2021, pp. 1-16.
European Extended Search Report for Application No. 23197087.2, mailed Jan. 16, 2024.
European Office Action for Application No. 23197087.2, mailed Nov. 13, 2025.

* cited by examiner

METHOD AND SYSTEM FOR LIGHT ABSORPTION ENHANCEMENT IN PHOTODIODES USING ON-CHIP PHASE MODULATING THIN-FILM OPTICS, RESONANT STRUCTURES AND METASURFACES

CROSS-REFERENCE TO RELATED APPLICATION

This application claims the priority benefit under 35 U.S.C. § 119(e) of U.S. Provisional Application No. 63/413,591, filed on Oct. 5, 2022, the disclosure of which is incorporated herein by reference in its entirety.

TECHNICAL FIELD

The subject matter disclosed herein relates to near-infrared CMOS image sensors. More particularly, the subject matter disclosed herein relates to a pixel for a CMOS image sensor having an improved Quantum Efficiency and/or photon detection efficiency at near infrared wavelengths.

BACKGROUND

Silicon-based CIS may have insufficient sensitivity and low Quantum Efficiency (QE) (<50%) because silicon has a low absorption characteristic, especially for radiation having a wavelength less than 900 nm. At Near Infrared (NIR) wavelengths, light absorption by silicon is low and most incident power (~80%) passes through the active region of a CIS without being absorbed.

FIGS. 1A and 1B are graphs that respectively show absorption coefficient and absorption depth of silicon, as disclosed on the pveducation.org website. In the graph of FIG. 1A, the absorption coefficient for a range of NIR wavelengths is about $1\times10^{-3}$ per cm at 700 nm to about $1\times10^{-2}$ per cm at 1200 nm. In the graph of FIG. 1B, the absorption depth for the same range of NIR wavelengths is about $1\times10^{-3}$ cm at 700 nm to between about $1\times10^{-2}$ cm and $1\times10^{-1}$ cm at 1200 nm. Thus, the absorption depth for this range of NIR wavelengths is well beyond the depth of most CMOS image sensors, which is typically between 100 nm to 1000 nm.

Accordingly, NIR CISs need better photon management techniques to boost quantum efficiency (QE) to be 50% or greater to make performance comparable to Red-Green-Blue (RGB) sensors. One way to improve QE is by increasing the thickness of Si, however, such an approach may add more cost, longer jitter time, and higher dark-noise issues caused by recombination.

Previous techniques that use nanostructures (NSs) for improving the absorption characteristic of photodiodes provide a low-scattering angle to scatter incident NIR light within a CIS to increase the path length of the incident light. The scattering angle provided by the nanostructures should be high and as steep as possible, which may be exceedingly difficult for Backside Scattering Technology (BST) due to an inherent low refractive index and size of the nanostructures that are used. Nevertheless, some previous nanostructure techniques use metaphotonics to bend the incident NIR light at high angles (>80°), which increases light absorption in a photodetector, such as disclosed by U.S. Patent Application Publication No. 2002/0359772 A1 to Siddique et al.

SUMMARY

An example embodiment provides a pixel for an image sensor that may include a photodiode, a thin-film layer and a reflective layer. The photodiode may include a first side and a second side that is opposite the first side and in which the photodiode receives incident light on the first side. The thin-film layer may be on the first side of the photodiode and may provide a unidirectional phase-shift to light passing from the photodiode to the thin-film layer. The reflective layer may be on the second side of the photodiode and may reflect light passing from the photodiode to the reflective layer toward the first side of the photodiode. In one embodiment, the thin-film layer may include at least one of nanostructures, liquid crystals, a phase-changing material and a thin film formed from metal, ceramic or plastic, and the unidirectional phase-shift may be a unidirectional $7C$ phase shift at a target light wavelength. In another embodiment, the target light wavelength may be a near infrared light wavelength. In still another embodiment, the thin-film layer may include a periodicity of nanostructures having a distance between the nanostructures that is substantially less than or equal to one-half of a wavelength of light at a predetermined wavelength. In yet another embodiment, the thin-film layer may be in direct contact with the photodiode. In one embodiment, a material forming the thin-film layer may include a refractive index that less than a refractive index of material forming the photodiode. In another embodiment, the thin-film layer may include nanostructures that project into the photodiode. In still another embodiment, the reflective layer may include a metal layer. In yet another embodiment, the reflective layer may include a thin-film nanostructure layer that provides a unidirectional phase-shift to light passing from the photodiode to the reflective layer. In one embodiment, the reflective layer may be a Distributed Bragg Reflector layer.

An example embodiment provides an image sensor that may include an array of pixels in which at least one pixel may include a photodiode, a thin-film layer and a reflective layer. The photodiode may include a first side and a second side that is opposite the first side and in which the photodiode receives incident light on the first side. The thin-film layer may be on the first side of the photodiode and may provide a unidirectional phase-shift to light passing from the photodiode to the thin-film layer. The reflective layer may be on the second side of the photodiode and may reflect light passing from the photodiode to the reflective layer toward the first side of the photodiode. In one embodiment, the thin-film layer may include at least one of nanostructures, liquid crystals, a phase-changing material and a thin film formed from metal, ceramic or plastic, and the unidirectional phase-shift may be a unidirectional $7C$ phase shift at a target light wavelength. In another embodiment, the target light wavelength may be a near infrared light wavelength. In still another embodiment, the thin-film layer may be a periodicity of nanostructures having a distance between the nanostructures that is substantially less than or equal to one-half of a wavelength of light at a predetermined wavelength. In yet another embodiment, the thin-film layer may be in direct contact with the photodiode. In one embodiment, a material forming the thin-film layer may include a refractive index that less than a refractive index of material forming the photodiode. In another embodiment, the thin-film layer may include nanostructures that project into the photodiode. In still another embodiment, the reflective layer may be a metal layer. In yet another embodiment, the reflective layer may include a thin-film nanostructure layer that provides a unidirectional phase-shift to light passing from the photodiode to the reflective layer. In one embodiment, the reflective layer may be a Distributed Bragg Reflector layer.

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 1B:
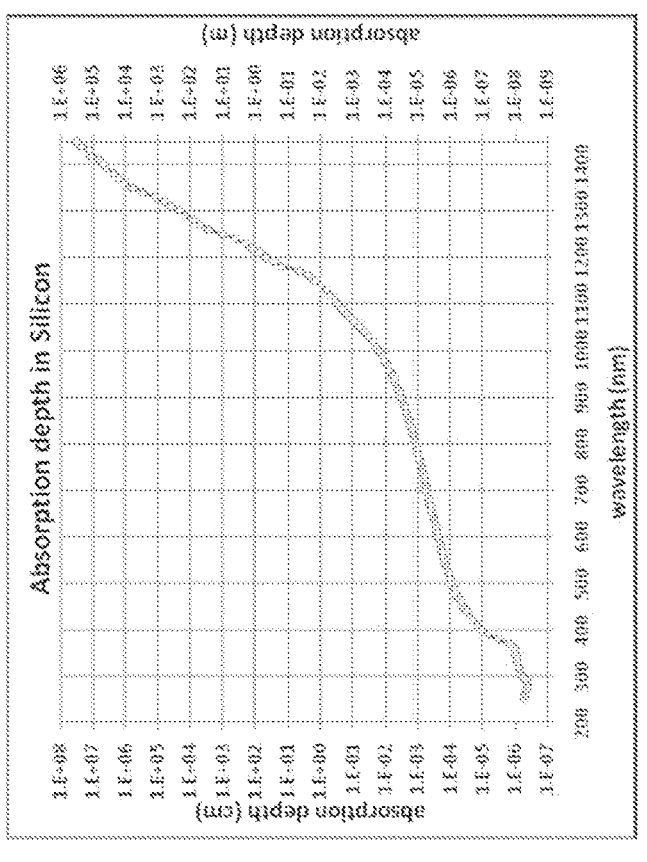
FIGS. 1A and 1B are graphs that respectively show absorption coefficient and absorption depth of silicon.
Figure 1B:
Figure 1A:
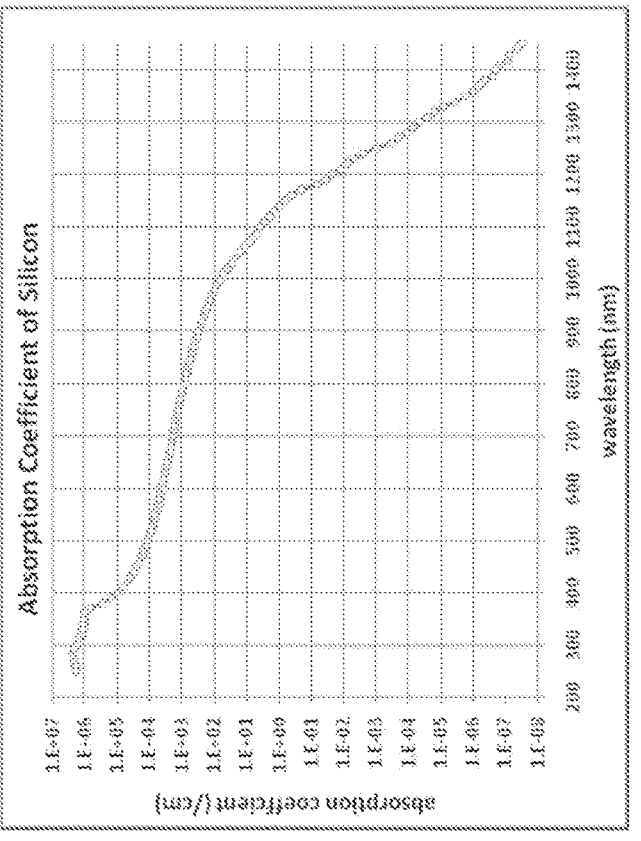

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The subject matter disclosed herein provides a metasurface-based techniques that improve the QE of different photodetectors (PDs) of NIR CIS sensors and provides a significant improvement in NIR light absorption over conventional designs including low-light applications. The techniques disclosed herein for image sensors are CMOS compatible techniques that provide simple, practical and low-cost solutions.

In one embodiment, the subject matter disclosed herein integrates phase-modulating thin-film optics with Si-based photodetectors, such as Single Photon Avalanche Diodes (SPADs), Avalanche Photodiodes (APDs), Quanta Image Sensor (QIS) diodes or p-type/insulator/n-type (PIN) diodes, to improve light absorption characteristics of the Si-based photodetectors. The phase-modulating thin-film optics include a metasurface and nanostructures (NSs), and/or a stack of thin-film liquid crystals, and/or a stack of thin-film metals, ceramics and plastics.

In one embodiment, phase-modulating thin-film optics, metasurfaces or metal films may be used on top and bottom surfaces of a PD to create a $\pi$ phase shift to create spatially localized resonances, or standing waves, at a target wavelength, thereby maximizing absorption within the PD. The same techniques may be applied to non-Si-based photodetection systems, including IR detectors ranging from NIR, SWIR to MWIR. In one embodiment, the sensor may be a non-Si based photo detection system, which includes IR detectors ranging from NIR, SWIR to MWIR using Indium Gallium Arsenide (InGaAs), Mercury Cadmium Telluride (HgCdTe), Indium Antimonide (InSb), Indium Arsenide (InAs), Lead Sulfide (PbS), Lead Selenide (PbSe), and Germanium (Ge).

In one embodiment, the subject matter disclosed herein provides a photodetector that may include phase-modulating thin-films on a top or a bottom or both the top and bottom of a photodetector region. The phase-modulating thin-film introduces a unidirectional $\pi$ phase shift to a target spectrum. The thin films, or metasurfaces, are optically transparent or minimally absorbent at the desired spectrum. The thin-films may be nanostructures and/or liquid crystals and/or a phase-change material coating. The nanostructures of the metasurface have a periodicity (i.e., a distance between two nanostructures) that is a subwavelength of the shortest wavelength of a target spectrum. That is, the periodicity of the nanostructures is less than or equal to one-half of the shortest wavelength of the target spectrum. The height (thickness) of the nanostructures will vary based on the size (width/length or diameter) and the periodicity of the nanostructures that create a it phase shift. In one embodiment, the phase-modulating thin-film optics may be multiple layers of metasurfaces or thin-films or combination of metasurfaces and thin-films. CMOS processing of $Si/SiO_x/Si_xN_y/Si_xO_yN_z/airgap$ (etched or extended features into pixel) may be used, with structure size (~10-500 nm) and height (50-5000 nm) or combination of both.

In one embodiment, a metal layer having a thickness that is greater than a skin-depth may be located on a front-side of the photodetector in the case of a back-illuminated sensor, or may be located on the back-side in the case of a front-illuminated sensor that reflects incident light back towards photodiode. In another embodiment, layers of a Distributed Bragg Reflector (DBR) may be used for a back-illuminated sensor or on the back-side for a front-illuminated sensor to reflect incident light back towards the photodiode on the front-side of the photodiode. The DBR layers may be formed from semiconductor, and/or metal oxides and nitrides and/or semiconductor oxides and nitrides.

In one embodiment, a thin film, or a metasurface, may be added on of top and/or a bottom of a PD region to form a resonant region that provides a significant improvement in light absorption of the PD region. Such a thin-film introduces a $\pi$ phase shift that creates spatially localized resonances, or standing waves, of a target wavelength, thereby maximizing NIR light absorption within the PD. Also, such a thin-film is optically transparent or minimally absorbent at a target wavelength or spectrum. In one embodiment, a thin-film may be formed from nanostructures, liquid crystals or a phase-change material coating. A size of the nanostructures should be a subwavelength of the target wavelength or target spectrum. That is, the distance or the periodicity between the structures (width/length/diameter) should be less than or equal to half of the shortest wavelength of a target spectrum.

Figure 2:
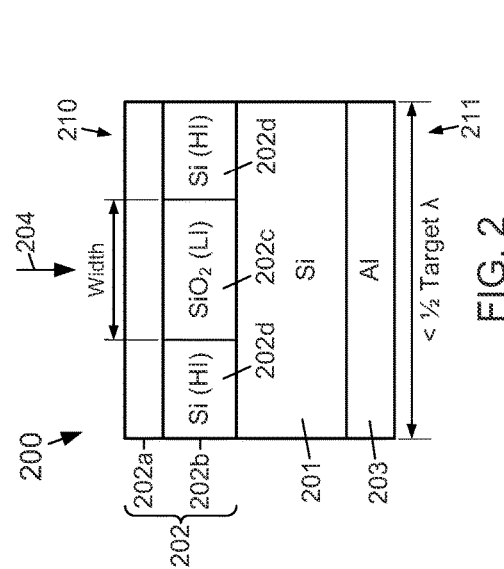
FIG. 2 depicts a cross-section view of an example embodiment of a pixel for a NIR CIS according to the subject matter disclosed herein.

FIG. 2 depicts a cross-section view of an example embodiment of a pixel 200 for a NIR CIS according to the subject matter disclosed herein. The pixel 200 includes a photodetector region 201, a $\pi$-phase-modulating thin-film layer 202, and a reflective layer 203. The $\pi$-phase-modulating thin-film layer 202 may be formed on a first side 210 of the photodetector region 201 and may include a base layer 202a and a nanostructure layer 202b. The nanostructure layer 202b may include nanostructures 202c and portions 202d between the nanostructures 202c. The reflective layer 203 may be formed on a second side 211 of the photodetector region 201. The pixel 200 may be configured to be a backside illuminated pixel or a frontside illuminated pixel. In either case, the incident light is received by the first side 210 of the pixel 200.

As depicted in FIG. 2, a nominal thickness of the photodetector region 201 may extend from the base layer 202$a$ to the reflective layer 203 so that the nanostructure layer 202$b$ effectively extends into the photodetector region 201. Alternatively, the pixel 200 may be configured so that the nominal thickness of the photodetector region 201 extends from the nanostructure layer 202$b$ to the reflective layer 203, and spaces between the low reflective-index material nanostructures may be filled with a high reflective-index material 202$d$. As yet another alternative, the π-phase-modulating thin-film layer 202 may be formed so that the π-phase-modulating thin-film layer 202 is not in direct contact with the photodetector region 201. In one embodiment, the distance between the photodetector region 201 and the π-phase-modulating thin-film layer 202 may be as small as 5 nm to avoid a structural and/or physical impact on the photodetector region 201 and to create some insulation. The maximum distance may depend on the optical performance and the materials and thicknesses of the π-phase-modulating thin-film layer 202. In one embodiment, the maximum distance may be in the 10-100s nm range.

In one embodiment, the photodetector region 201 may be formed from silicon (Si), p-type silicon (p-Si), amorphous silicon (a-Si) or any other form of silicon. Alternatively, photodetector region 201 may be a non-Si-based infrared photodetector ranging from NIR, SWIR to MWIR and may be formed using Indium Gallium Arsenide (InGaAs), Mercury Cadmium Telluride (HgCdTe), Indium Antimonide (InSb), Indium Arsenide (InAs), Lead Sulfide (PbS), Lead Selenide (PbSe), or Germanium (Ge).

In one embodiment, the base layer 202$a$ and the nanostructure layer 202$b$ may be formed from a low refractive-index material, such as but not limited to $SiO_x/Si_xN_y/Si_xO_yN_z$/airgap. The portions 202$d$ of the nanostructure layer 202$b$ may be formed from a high refractive-index material, such as but not limited to Si, a-Si, crystalline silicon (c-Si), p-Si, SiN, SiON, $HfO_2$, $TiO_2$, $Al_2O_3$. Alternatively, the π-phase-modulating thin-film layer 202 may be formed from a stack of thin-film liquid crystals, and/or a stack of thin-film metals, ceramics and plastics.

The reflective layer 203 may be formed from metal, a π-phase-modulating thin-film or a Distributed Bragg Reflector (DBR) layer. It should also be noted that although the reflective layer 203 and the photodetector region 201 are depicted in FIG. 2 as being in direct contact, alternative embodiments provide that the reflective layer 203 and the photodetector region 201 may be separated and not be in direct contact with each other.

Incident light traveling towards to the first side of the photodetector region 201 passes through the π-phase-modulating thin-film layer 202 without being absorbed and enters the photodetector region 201. The incident light travels through the low refractive-index material of the layer 202 and into the high refractive-index material of the photodetector region 201. As the light traverses through the photodetector region 201, some of the light is absorbed by the photodetector region 201. When the light encounters the reflective layer 203, the remaining light is reflected towards the layer 202. When the light encounters the layer 202, the light is traveling from the high refractive-index material of the photodetector region 201 to the low refractive-index material of the layer 202 and is substantially reflected towards to the reflective layer 203 through the photodetector region 201. As the light travels through the photodetector region 201, more light is absorbed. At the reflective layer, the light is reflected towards the layer 202. Light continues to travel through the photodetector region 201 until completely absorbed.

The π-phase-modulating thin-film layer 202 operates as a unidirectional π-phase-shift layer. For the π-phase-modulating thin-film layer 202 to operate as a unidirectional π-phase-shift layer, the layer 202 does not absorb light passing through the layer 202 into the photodetector region 201. The layer 202 also imparts a π phase shift to light passing from the high refractive-index material of the photodetector region 201 to the low refractive-index material of the layer 202. Additionally, the layer 202 also does not scatter light passing from the low refractive-index material of the layer 202 into the high refractive-index material of the photodetector region 201. This last characteristic means that the nanostructures of the nanostructure layer 202$b$ have a subwavelength size at a target wavelength. That is, the nanostructures of the nanostructure layer 202$b$ have a size (each of width, length and height (thickness) dimensions, or each of a diameter and a height (thickness)) that is less than or equal to one-half of the target wavelength. Shapes of the nanostructures of the nanostructure layer 202$b$ may be, but are not limited to, square, rectangular, cylindrical, pyramidal, inverse pyramidal, and randomly shaped as long as size/diameter/width of the nanostructures are less than or equal to one-half of the target wavelength. When the target includes a spectrum or a range of wavelengths, the nanostructures have a subwavelength size at the shortest wavelength of the target spectrum. In other words, for a target spectrum, the nano structures have a size that is less than or equal to one-half of the shortest wavelength of the target spectrum.

Figure 3:
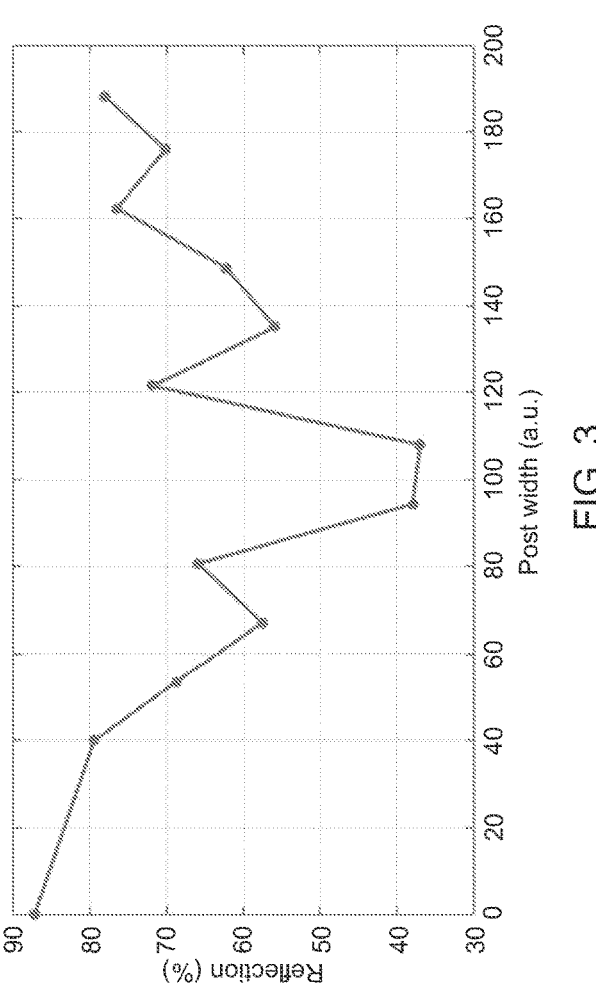
FIG. 3 is a graph conceptually showing a percentage reflection of incident light as a function of width of a nanostructure.

FIG. 3 is a graph conceptually showing a percentage reflection of incident light as a function of width of a nanostructure. The graph of FIG. 3 shows that conceptually as the width of a nanostructure increases from a width of 0 a.u., the percentage reflection of incident light decreases from near 90% reflection to less than 40% reflection when the width is about 95 a.u. to about 110 a.u. As the width increases from about 110 a.u., the percentage reflection of incident light increases back towards 80% reflection. Accordingly, for a given set of materials, the width of a nanostructure where a π-phase shift occurs is where reflection is minimized and absorption is maximized.

Figure 4:
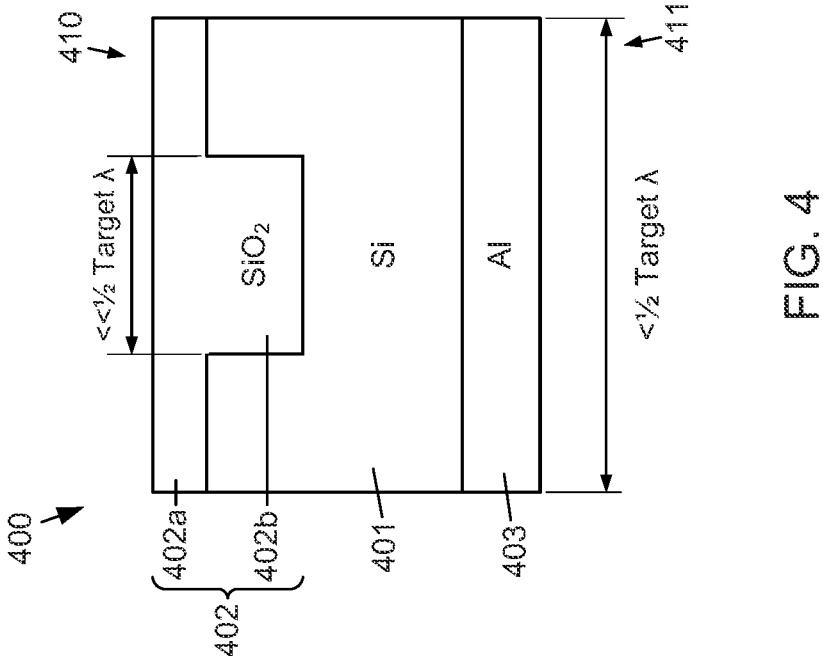
FIG. 4 depicts a cross-sectional view of a second example embodiment of a pixel according to the subject matter disclosed herein.

FIG. 4 depicts a cross-sectional view of a second example embodiment of a pixel 400 according to the subject matter disclosed herein. The pixel 400 includes a photodetector region 401, a π-phase-modulating thin-film layer 402, and a reflective layer 403. The π-phase-modulating thin-film layer 402 may be formed on a first side 410 of the photodetector region 401 and may include a base layer 402$a$ and a nanostructure layer 402$b$. The reflective layer 403 may be formed on a second side 411 of the photodetector region 401.

The photodetector region 401 may be formed from the same materials that may be used to form the photodetector region 201 of pixel 200. In one embodiment, the π-phase-modulating thin-film layer 402 may be formed from the same materials that may be used to form the π-phase-modulating thin-film layer 202 of pixel 200. The reflective layer 403 may be formed from metal, such as but not limited to aluminum (Al). Alternatively, the π-phase-modulating thin-film layer 402 may be formed from a stack of thin-film liquid crystals, and/or a stack of thin-film metals, ceramics and plastics.

Figure 5:
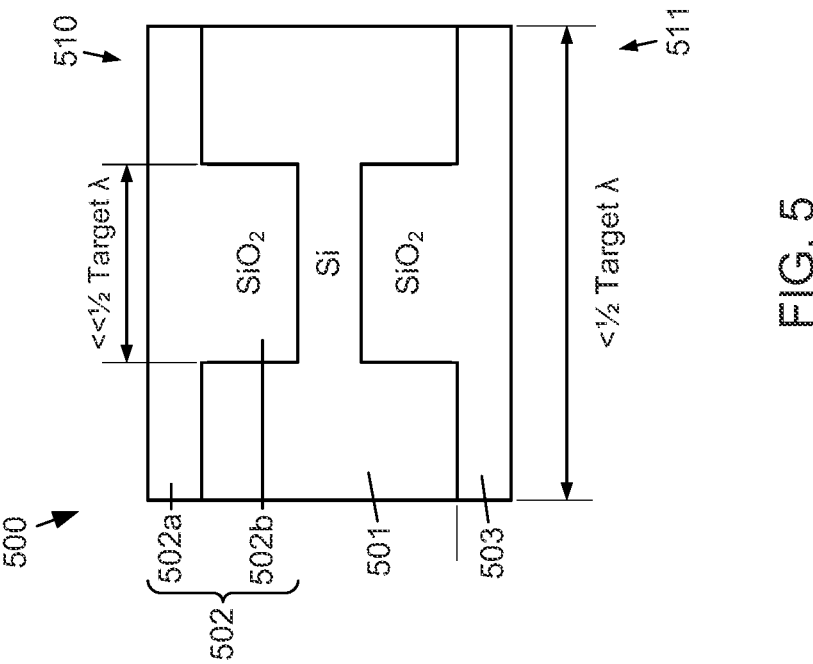
FIG. 5 depicts a cross-sectional view of a third example embodiment of a pixel according to the subject matter disclosed herein.

FIG. 5 depicts a cross-sectional view of a third example embodiment of a pixel 500 according to the subject matter disclosed herein. The pixel 500 includes a photodetector region 501, a π-phase-modulating thin-film layer 502, and a reflective layer 503. The π-phase-modulating thin-film layer 502 may be formed on a first side 510 of the photodetector region 501 and may include a base layer 502a and a nanostructure layer 502b. The reflective layer 503 may be formed on a second side 511 of the photodetector region 501.

The photodetector region 501 may be formed from the same materials that may be used to form the photodetector region 201 of pixel 200. The π-phase-modulating thin-film layer 502 may be formed from the same materials that may be used to form the π-phase-modulating thin-film layer 202 of pixel 200. In one embodiment, the reflective layer 501 may be a π-phase-modulating thin-film layer like the π-phase modulating thin-film layer 202 of pixel 200. Alternatively, the π-phase-modulating thin-film layer 502 may be formed from a stack of thin-film liquid crystals, and/or a stack of thin-film metals, ceramics and plastics.

Figure 6:
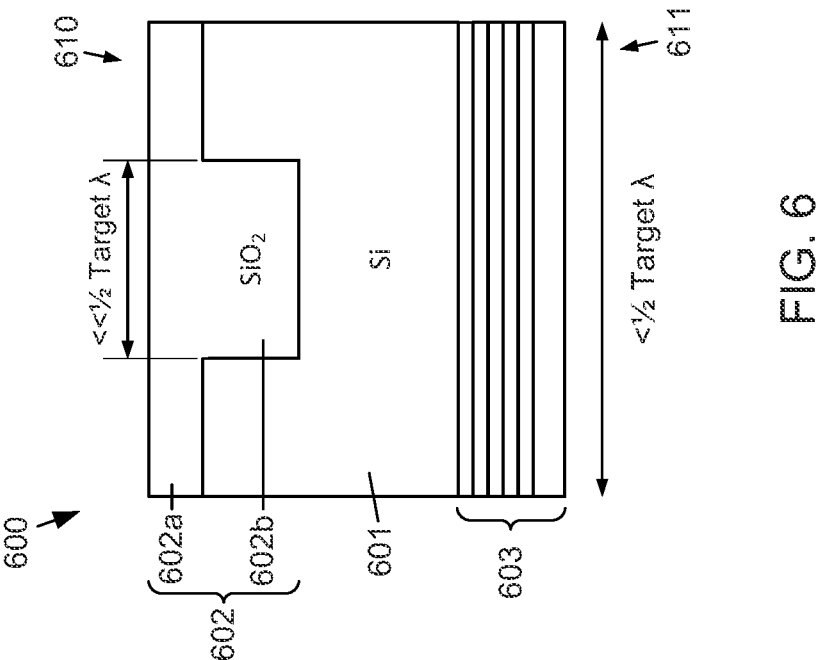
FIG. 6 depicts a cross-sectional view of a fourth example embodiment of a pixel according to the subject matter disclosed herein.

FIG. 6 depicts a cross-sectional view of a fourth example embodiment of a pixel 600 according to the subject matter disclosed herein. The pixel 600 includes a photodetector region 601, a π-phase-modulating thin-film layer 602, and a reflective layer 603. The π-phase-modulating thin-film layer 602 may be formed on a first side 610 of the photodetector region 601 and may include a base layer 602a and a nanostructure layer 602b. The reflective layer 603 may be formed on a second side 611 of the photodetector region 601.

The photodetector region 601 may be formed from the same materials that may be used to form the photodetector region 201 of pixel 200. In one embodiment, the π-phase-modulating thin-film layer 602 may be formed from the same materials that may be used to form the π-phase-modulating thin-film layer 202 of pixel 200. Alternatively, the π-phase-modulating thin-film layer 602 may be formed from a stack of thin-film liquid crystals, and/or a stack of thin-film metals, ceramics and plastics. The reflective layer 501 may be a Distributed Bragg Reflector (DBR) layer.

Figure 7:
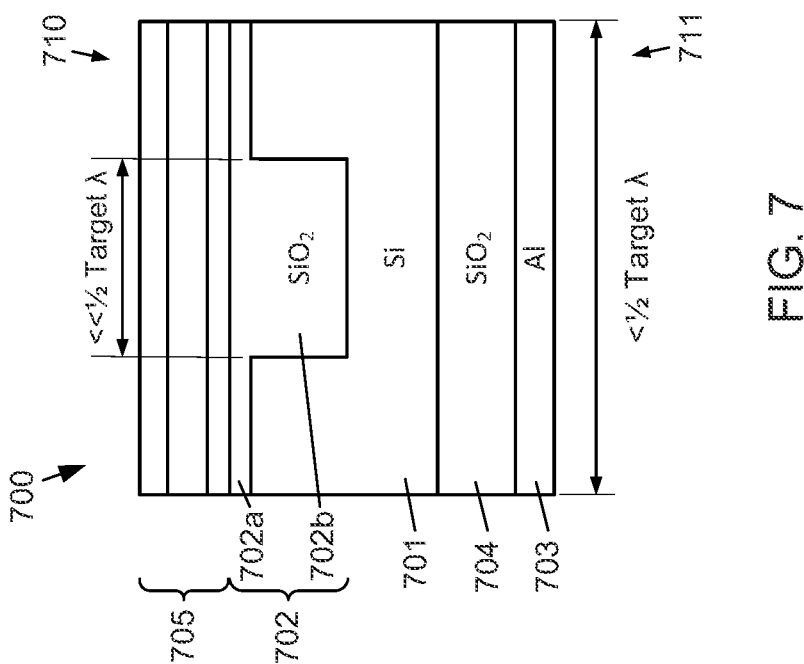
FIG. 7 depicts a cross-sectional view of a fifth example embodiment of a pixel according to the subject matter disclosed herein.

FIG. 7 depicts a cross-sectional view of a fifth example embodiment of a pixel 700 according to the subject matter disclosed herein. The pixel 700 includes layers that are commonly found in commercially available pixels, such as passivation layers and anti-reflection layers. The pixel 700 includes a photodetector region 701, a π-phase-modulating thin-film layer 702, and a reflective layer 703. The π-phase-modulating thin-film layer 702 may be formed on a first side 710 of the photodetector region 701 and may include a base layer 702a and a nanostructure layer 702b. The reflective layer 703 may be formed on a second side 711 of the photodetector region 701. The photodetector region 701 may be formed from materials described in connection with the pixel 200 in FIG. 2. In one embodiment, the π-phase-modulating thin-film layer 702 may be formed from materials described in connection with the pixel 200 in FIG. 2. Alternatively, the π-phase-modulating thin-film layer 702 may be formed from a stack of thin-film liquid crystals, and/or a stack of thin-film metals, ceramics and plastics. The reflective layer 703 may be formed from aluminum.

The pixel 700 may also include an $SiO_2$ passivation layer 704 between the photodetector region 701 and the reflective layer 703. Passivation and anti-reflection layers may be formed at 705 on the π-phase-modulating thin-film layer 702.

Figure 8:
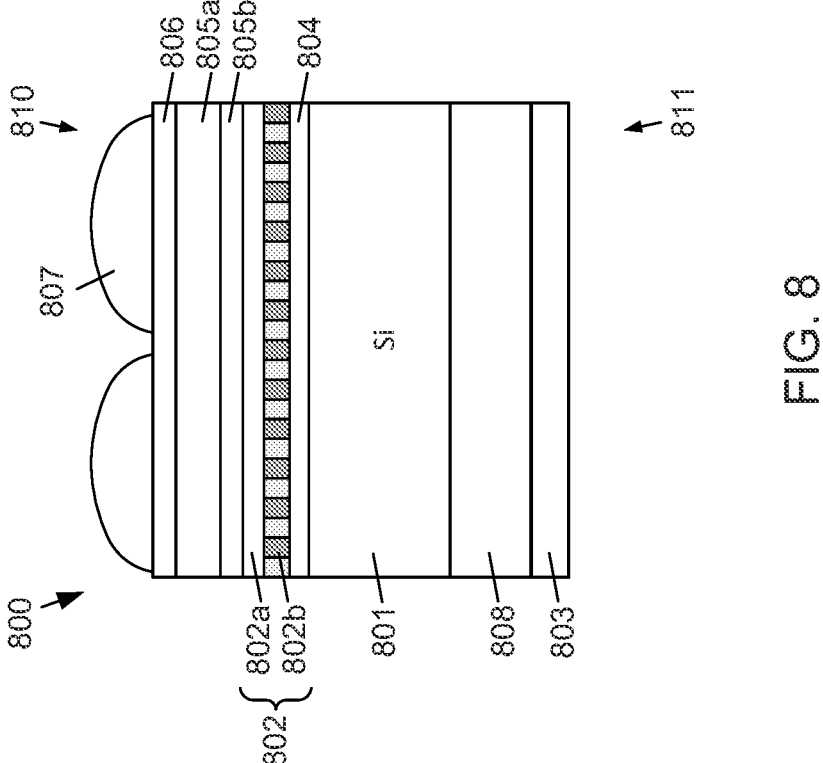
FIG. 8 depicts a cross-sectional view of a sixth example embodiment of a pixel according to the subject matter disclosed herein.

FIG. 8 depicts a cross-sectional view of a sixth example embodiment of a pixel 800 according to the subject matter disclosed herein. In particular, FIG. 8 depicts a back-side-illuminated (BSI) sensor pixel. The same principle will work for a front-side-illuminated (FSI) sensor pixel. The pixel 800 includes a photodetector region 801, a π-phase-modulating thin-film layer 802, and a reflective layer 803. The metal wirings and relevant circuits may be formed after 803 for BSI sensor. The π-phase-modulating thin-film layer 802 may be formed on a first side 810 of the photodetector region 801 and may include a base layer 802a and a nanostructure layer 802b. The reflective layer 803 may be formed on a second side 811 of the photodetector region 801.

The photodetector region 801 may be formed from the same materials that may be used to form the photodetector region 201 of pixel 200. In one embodiment, the π-phase-modulating thin-film layer 802 may be formed from the same materials that may be used to form the π-phase-modulating thin-film layer 202 of pixel 200. Alternatively, the π-phase-modulating thin-film layer 802 may be formed from a stack of thin-film liquid crystals, and/or a stack of thin-film metals, ceramics and plastics. The reflective layer 803 may be formed from metal, such as but not limited to aluminum (Al).

The pixel 800 may also include a passivation film 804 formed from, for example, $SiO_2$, that may be formed between the photodetector region 801 and the π-phase-modulating thin-film layer 802 so that the π-phase-modulating thin-film layer 802 is not in direct contact with the photodetector region 801. Antireflective films 805a and 805b formed from layers of oxides and nitrides may be formed on the π-phase-modulating thin-film layer 802. A flat coating layer 806 may be formed on the antireflective films 805. Microlenses 807 may be formed on the flat coating layer 806. The flat coating layer 806 may be formed from the materials forming the microlenses 807. A passivation film layer 808 formed from, for example, $SiO_2$, may be formed between the photodetector region 801 and the reflective layer 803.

Figure 9:
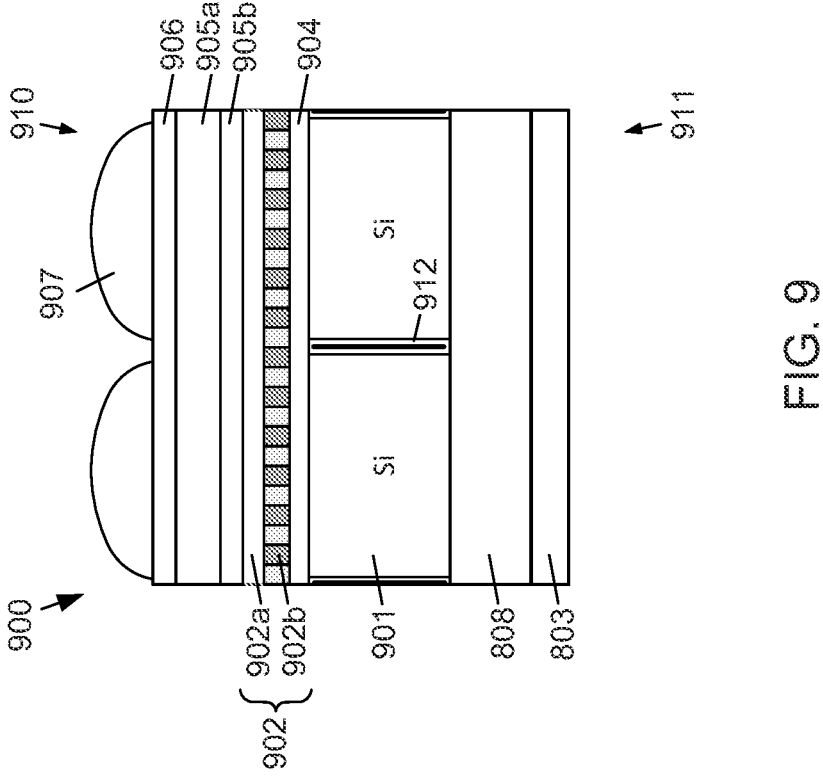
FIG. 9 depicts a cross-sectional view of a seventh example embodiment of two pixels according to the subject matter disclosed herein.

FIG. 9 depicts a cross-sectional view of a seventh example embodiment of two pixels 900 according to the subject matter disclosed herein. A pixel 900 includes a photodetector region 901, a π-phase-modulating thin-film layer 902, and a reflective layer 903. The π-phase-modulating thin-film layer 902 may be formed on a first side 910 of the photodetector region 901 and may include a base layer 902a and a nanostructure layer 902b. The reflective layer 903 may be formed on a second side 911 of the photodetector region 901.

The photodetector region 901 may be formed from the same materials that may be used to form the photodetector region 201 of pixel 200. In one embodiment, the π-phase-modulating thin-film layer 902 may be formed from the same materials that may be used to form the π-phase-modulating thin-film layer 202 of pixel 200. Alternatively, the π-phase-modulating thin-film layer 902 may be formed from a stack of thin-film liquid crystals, and/or a stack of thin-film metals, ceramics and plastics. The reflective layer 903 may be formed from metal, such as but not limited to aluminum (Al).

The pixel 900 may also include a passivation film 904 formed from, for example, $SiO_2$, that may be formed between the photodetector region 901 and the π-phase-modulating thin-film layer 902 so that the π-phase-modulating thin-film layer 902 is not in direct contact with the photodetector region 901. Antireflective films 905a and 905b formed from layers of oxides and nitrides may be formed on the π-phase-modulating thin-film layer 902. A flat coating layer 906 may be formed on the antireflective films 905. Microlenses 907 may be formed on the flat coating 906. The flat coating layer 906 may be formed from the materials forming the microlenses 907. A passivation film layer 908 also formed from, for example, $SiO_2$, may be formed between the photodetector region 901 and the reflective layer 903. Deep trench isolation structures 912 may be formed between individual pixels, and may be form to include reflective walls formed from, for example, metal, doped semiconductor or may be empty with an airgap. Deep trench isolation structures may help to reduce cross-talks between the pixels. Such trench isolation structures may be shallow or, alternatively, cover a full-depth of the PD.

Figures 10A, 10B:
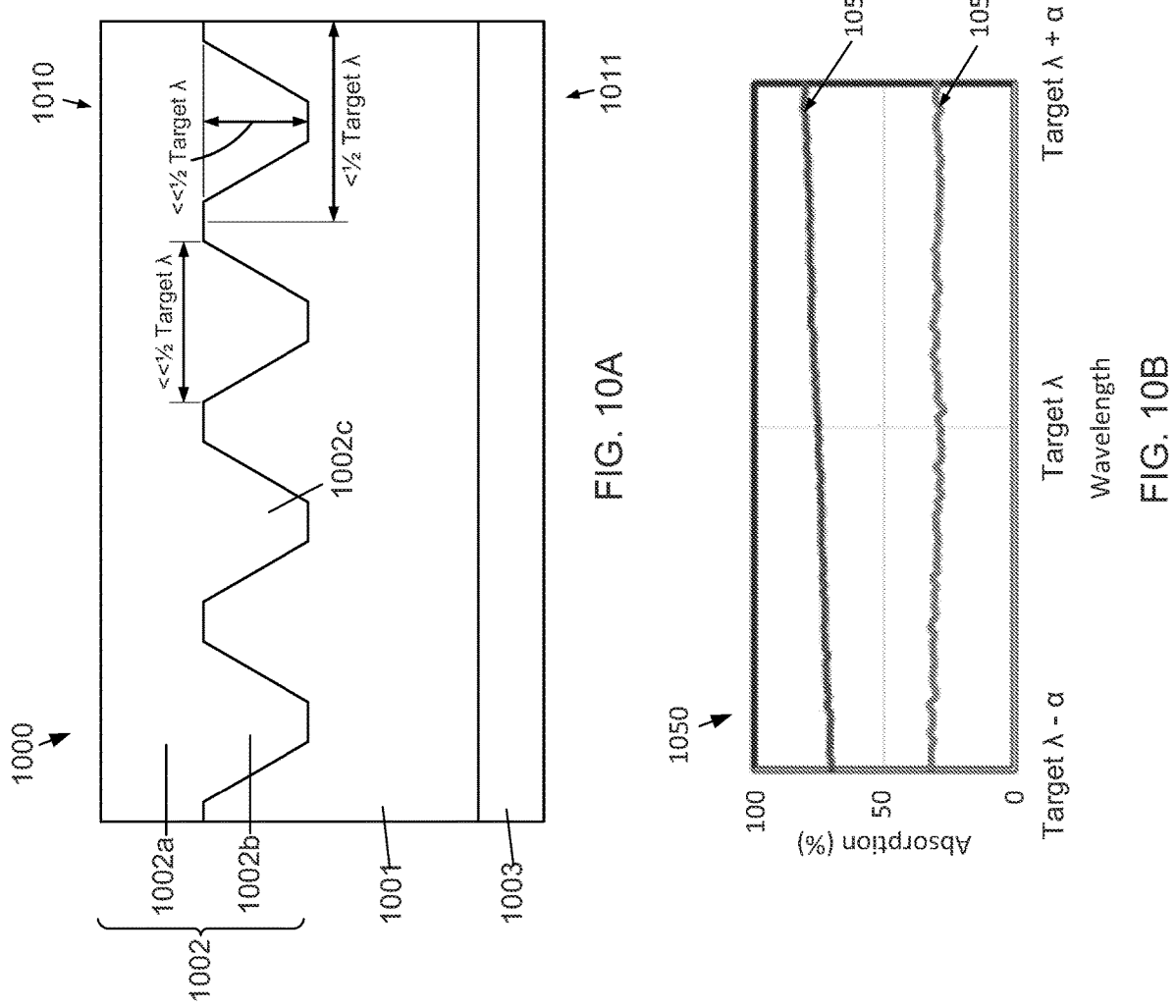
FIG. 10A depicts a cross-sectional view of an eighth example embodiment of pixel according to the subject matter disclosed herein.
FIG. 10B is a graph conceptually showing percentage absorption of incident light as a function of wavelength for the pixel with and without the π-phase-modulating thin-film layer of FIG. 10A according to the subject matter disclosed herein.

FIG. 10A depicts a cross-sectional view of a sixth example embodiment of pixel 800 according to the subject matter disclosed herein. The pixel 1000 includes a photodetector region 1001, a π-phase-modulating thin-film layer 1002, and a reflective layer 1003. The π-phase-modulating thin-film layer 1002 may be formed on a first side 1010 of the photodetector region 1001 and may include a base layer 1002a and a nanostructure layer 1002b. The nanostructure layer 1002b may include nanostructures 1002c. Regions between the nanostructures 1002c may be formed by material of the photodetector region 1001. The reflective layer 1003 may be formed on a second side 1011 of the photodetector region 1001. The photodetector region 1001 may be formed from p-Si. In one embodiment, the π-phase-modulating thin-film layer 1002 may be formed from $SiO_2$. Alternatively, the π-phase-modulating thin-film layer 1002 may be formed from a stack of thin-film liquid crystals, and/or a stack of thin-film metals, ceramics and plastics. The reflective layer 1003 may be formed from aluminum. Like the pixel 200 in FIG. 2, the pixel 1000 may be configured to be a backside illuminated pixel or a frontside illuminated pixel.

FIG. 10B is a graph 1050 conceptually showing percentage absorption of incident light as a function of wavelength for the pixel 1000 with and without the π-phase-modulating thin-film layer 1002 according to the subject matter disclosed herein. Curve 1051 shows percentage absorption of incident light for the pixel 1000, and curve 1052 shows the percentage absorption of incident light for the pixel 1000 without the thin-film layer 1002.

Figure 11:
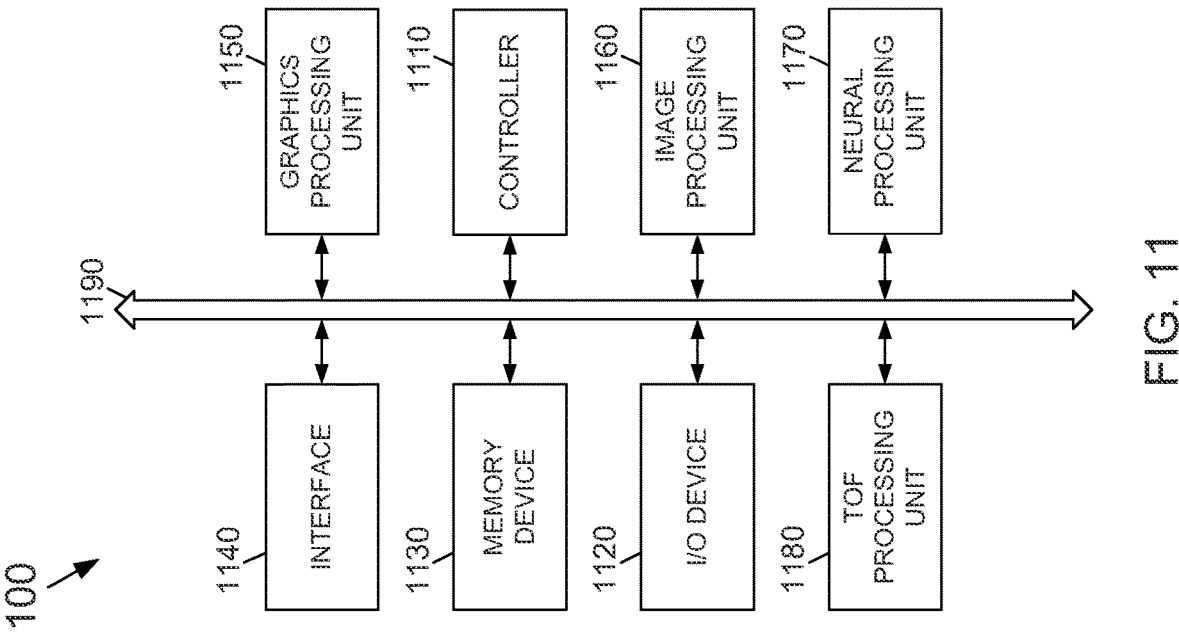
FIG. 11 depicts an electronic device that may include an image sensor that includes at least one pixel according to the subject matter disclosed herein.

FIG. 11 depicts an electronic device 1100 that may include an image sensor that includes at least one pixel according to the subject matter disclosed herein. Electronic device 1100 and the various system components of electronic device 1100 may be formed from one or modules. The electronic device 1100 may include a controller (or CPU) 1110, an input/output device 1120 such as, but not limited to, a keypad, a keyboard, a display, a touch-screen display, a 2D image sensor, a 3D image sensor, a memory 1130, an interface 1140, a GPU 1150, an imaging-processing unit 1160, a neural processing unit 1170, a TOF processing unit 1180 that are coupled to each other through a bus 1190. In one embodiment, the 2D image sensor and/or the 3D image sensor may be part of the imaging processing unit 1160. In one embodiment, one or both of the 2D and 3D image sensors may include at least one pixel according to the subject matter disclosed herein. In another embodiment, the 3D image sensor may be part of the TOF processing unit 1180. The controller 1110 may include, for example, at least one microprocessor, at least one digital signal processor, at least one microcontroller, or the like. The memory 1130 may be configured to store a command code to be used by the controller 1110 and/or to store a user data.

The interface 1140 may be configured to include a wireless interface that is configured to transmit data to or receive data from, for example, a wireless communication network using a RF signal. The wireless interface 1140 may include, for example, an antenna. The electronic system 1100 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A pixel for an image sensor, comprising:
a photodiode comprising a first side and a second side that is opposite the first side, the photodiode receiving incident light on the first side;
a thin-film layer on the first side of the photodiode that provides a unidirectional phase-shift to light passing from the photodiode to the thin-film layer; and
a reflective layer on the second side of the photodiode that reflects light passing from the photodiode to the reflective layer toward the first side of the photodiode.

2. The pixel of claim 1, wherein the thin-film layer comprises at least one of nanostructures, liquid crystals, a phase-changing material and a thin film formed from metal, ceramic or plastic, and
wherein the unidirectional phase-shift is a unidirectional π phase shift at a target light wavelength.

3. The pixel of claim 2, wherein the target light wavelength comprises a near infrared light wavelength.

4. The pixel of claim 1, wherein the thin-film layer comprises a periodicity of nanostructures having a distance between the nanostructures that is substantially less than or equal to one-half of a wavelength of light at a predetermined wavelength.

5. The pixel of claim 4, wherein the thin-film layer is in direct contact with the photodiode.

6. The pixel of claim 1, wherein a material forming the thin-film layer comprises a refractive index that less than a refractive index of material forming the photodiode.

7. The pixel of claim 1, wherein the thin-film layer comprises nanostructures that project into the photodiode.

8. The pixel of claim 1, wherein the reflective layer comprises a metal layer.

9. The pixel of claim 1, wherein the reflective layer comprises a thin-film nanostructure layer that provides a unidirectional phase-shift to light passing from the photodiode to the reflective layer.

10. The pixel of claim 1, wherein the reflective layer comprises a Distributed Bragg Reflector layer.

11. An image sensor, comprising:
an array of pixels, at least one pixel comprising:
a photodiode comprising a first side and a second side that is opposite the first side, the photodiode receiving incident light on the first side;
a thin-film layer on the first side of the photodiode that provides a unidirectional phase-shift to light passing from the photodiode to the thin-film layer; and
a reflective layer on the second side of the photodiode that reflects light passing from the photodiode to the reflective layer toward the first side of the photodiode.

12. The image sensor of claim 11, wherein the thin-film layer comprises at least one of nanostructures, liquid crystals, a phase-changing material and a thin film formed from metal, ceramic or plastic, and
wherein the unidirectional phase-shift is a unidirectional π phase shift at a target light wavelength.

13. The image sensor of claim 12, wherein the target light wavelength comprises a near infrared light wavelength.

14. The image sensor of claim 11, wherein the thin-film layer comprises a periodicity of nanostructures having a distance between the nanostructures that is substantially less than or equal to one-half of a wavelength of light at a predetermined wavelength.

15. The image sensor of claim 14, wherein the thin-film layer is in direct contact with the photodiode.

16. The image sensor of claim 11, wherein a material forming the thin-film layer comprises a refractive index that less than a refractive index of material forming the photodiode.

17. The image sensor of claim 11, wherein the thin-film layer comprises nanostructures that project into the photodiode.

18. The image sensor of claim 11, wherein the reflective layer comprises a metal layer.

19. The image sensor of claim 11, wherein the reflective layer comprises a thin-film nanostructure layer that provides a unidirectional phase-shift to light passing from the photodiode to the reflective layer.

20. The image sensor of claim 11, wherein the reflective layer comprises a Distributed Bragg Reflector layer.

* * * * *